United States Patent [19]

Oishi et al.

[11] Patent Number: 5,420,103
[45] Date of Patent: May 30, 1995

[54] A-AXIS SUPERCONDUCTOR ON A YTTRIUM OXIDE FILM

[75] Inventors: Akira Oishi, Kawasaki; Tadataka Morishita, Yokohama, both of Japan

[73] Assignee: International Superconductivity Technology Center, Japan

[21] Appl. No.: 108,772

[22] Filed: Aug. 19, 1993

Related U.S. Application Data

[63] Continuation of Ser. No. 786,841, Nov. 1, 1991, abandoned.

[30] Foreign Application Priority Data

Nov. 5, 1990 [JP] Japan .................. 2-299419

[51] Int. Cl.$^6$ ............................................. B32B 9/00
[52] U.S. Cl. .................... 505/239; 505/701; 505/238; 428/688; 428/930
[58] Field of Search ............ 505/1, 701, 702, 703, 505/704, 190, 191, 237, 238, 239; 428/688, 210, 689, 698, 930; 257/35

[56] References Cited

U.S. PATENT DOCUMENTS 4,962,086 10/1990 Gallagher et al. .................. 505/1
5,047,385 9/1991 Beasley .............................. 505/1

FOREIGN PATENT DOCUMENTS 1003917 9/1989 Japan .................................. 505/1

OTHER PUBLICATIONS

K Hirata et al, Appl. Phys. Lett., 56,683 (1990) Feb. 12, 1990.
Chen et al, Appl. Phys. A, 50, 165 (1990) Feb., 1990.
Oishi et al., Appl. Phys. Lett., 59, 1902 (1991) Nov. 7, 1991.
Patent Abstracts of Japan, vol. 12, No. 118, Apr. 1988.
Journal of Crystal Growth, vol. 49, 1980, pp. 71–76, Tsuiki et al.
Vide, Les Couches Minces, vol. 252, Jul. 1990, pp. 170–171 Boucher.
Materials Letters, vol. 8, No. ½ Apr. 1989, pp. 49–52 Williams.
Doss, "Engineers Guide to High T. Supercond," Wiley & Sons 1989, 102–109, 266–269.
Samara, "Low Temperature dielectric properties of candidate substrates for high $T_c$ superconductors: LaAlO$_3$ and ZrO$_2$: 9.5 mol % $_2^1$O$_3$." J. Appl. Phys. 68(8) Oct. 15, 1990 pp. 4214.
Chen et al., "The mechanism of CuO Segregations in YBaCuO/YS7 Thin Films," Appl. Phys A 50, 165–168 (1990).
Berezin et al., "YiBa$_2$Cu$_3$O$_{7-x}$ thin films grown on sapphire with epitaxial MgO buffer layers," Appl. Phys. Lett. 57(1), Jul. 2, 1990 pp. 90–92.
Gurvith, et al. "A metal alloy process for the formation of an oxide superconducting films: Advantages, problems substrate interactions, buffer layers," Material Research Sym Proc vol. 99, 1988 Matl Rsh Society pp. 297–300.
Eom et al. "Epitaxial: Smooth Films of a–Axis YBa$_2$Cu$_3$O$_7$" Science, vol. 249 Sep. 28, 1990 pp. 1549–1552.
Oishi et al., Appl. Phys. Lett., 59, 1902 (1991) Nov. 7, 1991.

Primary Examiner—Patrick J. Ryan
Assistant Examiner—Patrick Jewik
Attorney, Agent, or Firm—Lorusso & Loud

[57] ABSTRACT

A LnBaCuO-series superconducting thin film is provided over a surface of a substrate of Y$_2$O$_3$ single crystal to form a composite superconductor. Ln stands for Y or a lanthanoid element. The composite superconductor has an improved interfacial diffusion.

3 Claims, 6 Drawing Sheets

F I G. 4
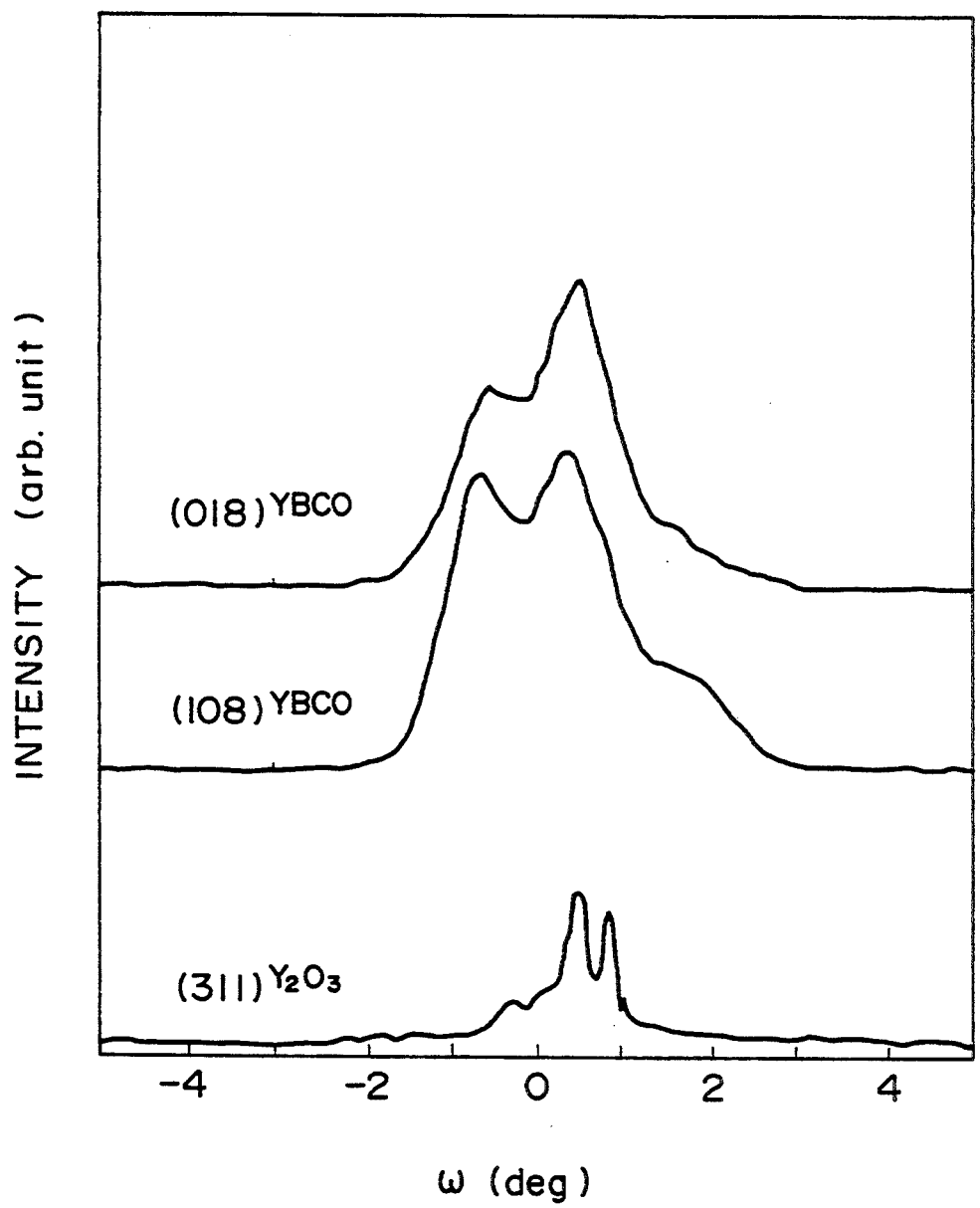

A-AXIS SUPERCONDUCTOR ON A YTTRIUM OXIDE FILM

This application is a continuation of application Ser. No. 07/786,841, filed 01 Nov. 1991, now abandoned.

This invention relates to a composite superconductor composed of a substrate and a superconducting metal oxide film provided on the substrate.

Superconductors of a YBaCuO type are known to show critical temperatures (Tc) as high as 90K. According to a method suggested by Murakami et al, in which superconductor phase is formed from a fused state, YBaCuO superconductors having a high critical current density (Jc) of 10,000 A/cm$^2$ at a magnetic flux density of 1 T (tesla) can be produced (Japanese Journal of Applied Physics, 29, 1189 (1989)).

When a YBaCuO superconducting material is used in the form of a thin film, it is necessary to form the film on a suitable substrate. Hitherto, a MgO substrate has been predominantly used. For the purpose of improving the quality of such a composite superconductor, SrTiO$_3$, NdGaO$_3$ and YAlO$_3$ have been proposed as a material of the substrate. These substrates are expected to provide a composite superconductor having good lattice consistency because the lattice constant thereof resembles that of the YBaCuO film and because the YBaCuO superconducting thin film may be formed thereon through epitaxial growth. It has been found, however, that the quality of the composite superconductor is deteriorated when the thickness of the YBaCuO film is reduced. It is important that the YBaCuO film should have a very small thickness of less than 1000 Å in order to obtain optimum results.

The present invention has been made to solve the problem of the known composite superconductors. In accordance with the present invention there is provided a composite superconductor comprising a substrate of Y$_2$O$_3$ single crystal, and a superconducting layer provided on a surface of said substrate and formed of metal oxides containing Ln, Ba, Cu and O wherein Ln stands for an element selected from the group consisting of Y and elements belonging to the lanthanoid.

It has been found that interfacial diffusion of the elements constituting the substrate accounts for the deterioration of the superconducting characteristics of the known composite superconductors using a SrTiO$_3$, NdGaO$_3$ or YAlO$_3$ substrate for supporting a super-thin YBaCuO film. Namely, the substrate of the known composite superconductor contains one or more heteroelements, such as Sr, Ti, Ga or Al, which are not present in the YBaCuO film. Such a hetero-element diffuses into the superconducting film during the formation thereof on the substrate. When the superconducting film is very thin, the influence of the interfacial diffusion of the hetero-element is neglectable.

The use of a Y$_2$O$_3$ substrate has now been found to solve the problem of interfacial diffusion. Thus, the composite superconductor according to the present invention exhibits excellent superconducting characteristics even when the YBaCuO film has a thickness of 1000 Å or less.

The present invention will now be described in detail below with reference to the accompanying drawings, in which:

FIG. 4 shows rocking curves of the (018) and (108) planes of the YBa$_2$Cu$_3$O$_x$ film and the (311) plane of the Y$_2$O$_3$ substrate of the composite superconductor obtained in Example 1 with respect to the <011> plane of the Y$_2$O$_3$ substrate;

Figure 1:
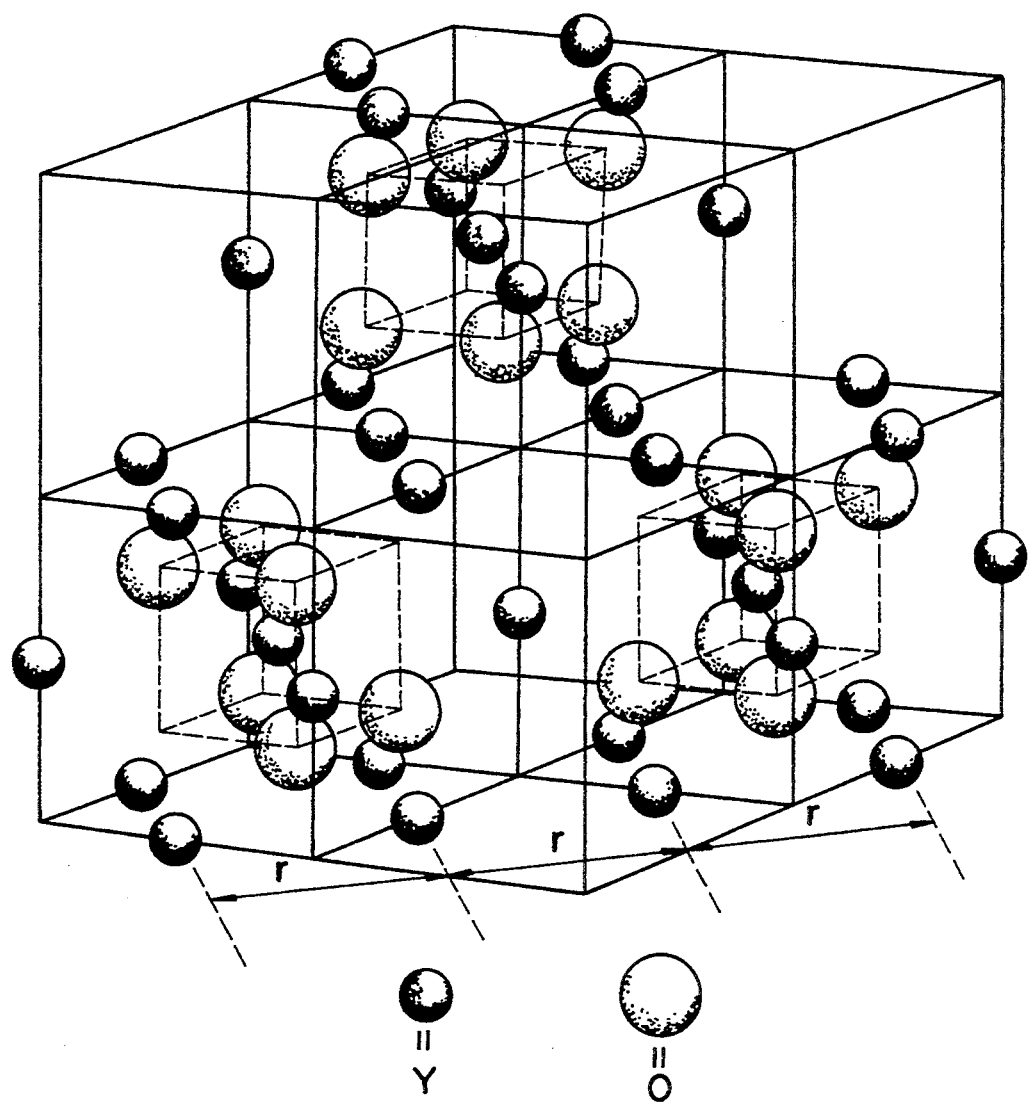
FIG. 1 is a schematic illustration of the crystal structure of Y$_2$O$_3$ single crystal.

As shown in FIG. 1, the crystal structure of Y$_2$O$_3$ is a cubic system in which the lattice constant is 10.60 Å. Thus, the bond length r is 3.75 Å. On the other hand, the lattice constants of YBa$_2$Cu$_3$O$_x$ (x is a number of 6–7) are 3.82 Å in the a-axis, 3.89 Å in the b-axis and 11.68 Å ($\approx$3.89$\times$3 Å) in the c-axis. Therefore, the lattice mismatching in the a-, b- and c-axes are only 1.9%, 3.7% and 3.7% respectively. This indicates that the use of Y$_2$O$_3$ substrates permits epitaxial growth of YBa$_2$Cu$_3$O$_x$ thereon.

In the case of YBa$_2$Cu$_4$O$_x$ (x is a number of 8–10), the lattice constants in the a-, b- and c-axes are 3.84 Å, 3.87 Å and 27.24 Å ($\approx$3.89$\times$7 Å), respectively. Therefore, this superconducting film too has good matching with the single crystal Y$_2$O$_3$ substrate.

The single crystal Y$_2$O$_3$ substrate may be prepared in any known manner. Provided over a surface of the Y$_2$O$_3$ substrate is a superconducting layer of metal oxides containing Ln, Ba, Cu and O wherein Ln stands for an element selected from the group consisting of Y and elements belonging to the lanthanoid consisting of La, Ce, Pr, Nd, Pm, Sm, Eu, Gd, Tb, Dy, Ho, Er, Tm, Yb and Lu. Preferably, the superconducting layer is formed of metal oxides having the following formula:

LnBa$_2$Cu$_y$O$_x$ wherein Ln stands for an element selected from the group consisting of Y, La, Ce, Nd, Pm, Eu, Gd, Tb, Dy, Ho, Er, Tm, Yb and Lu, y is a number between 3 and 4 and x is a number between 6 and 10.

The superconducting layer may be formed on the Y$_2$O$_3$ substrate by the pulsed laser deposition method, the chemical vapor deposition method, the magnetron sputtering method, the molecular beam epitaxy method or any other known method. The superconducting layer preferably has a thickness in the range of from 60 to 5000 Å, more preferably 100–1000 Å.

The following examples will further illustrate the present invention.

EXAMPLE 1

Figure 2:
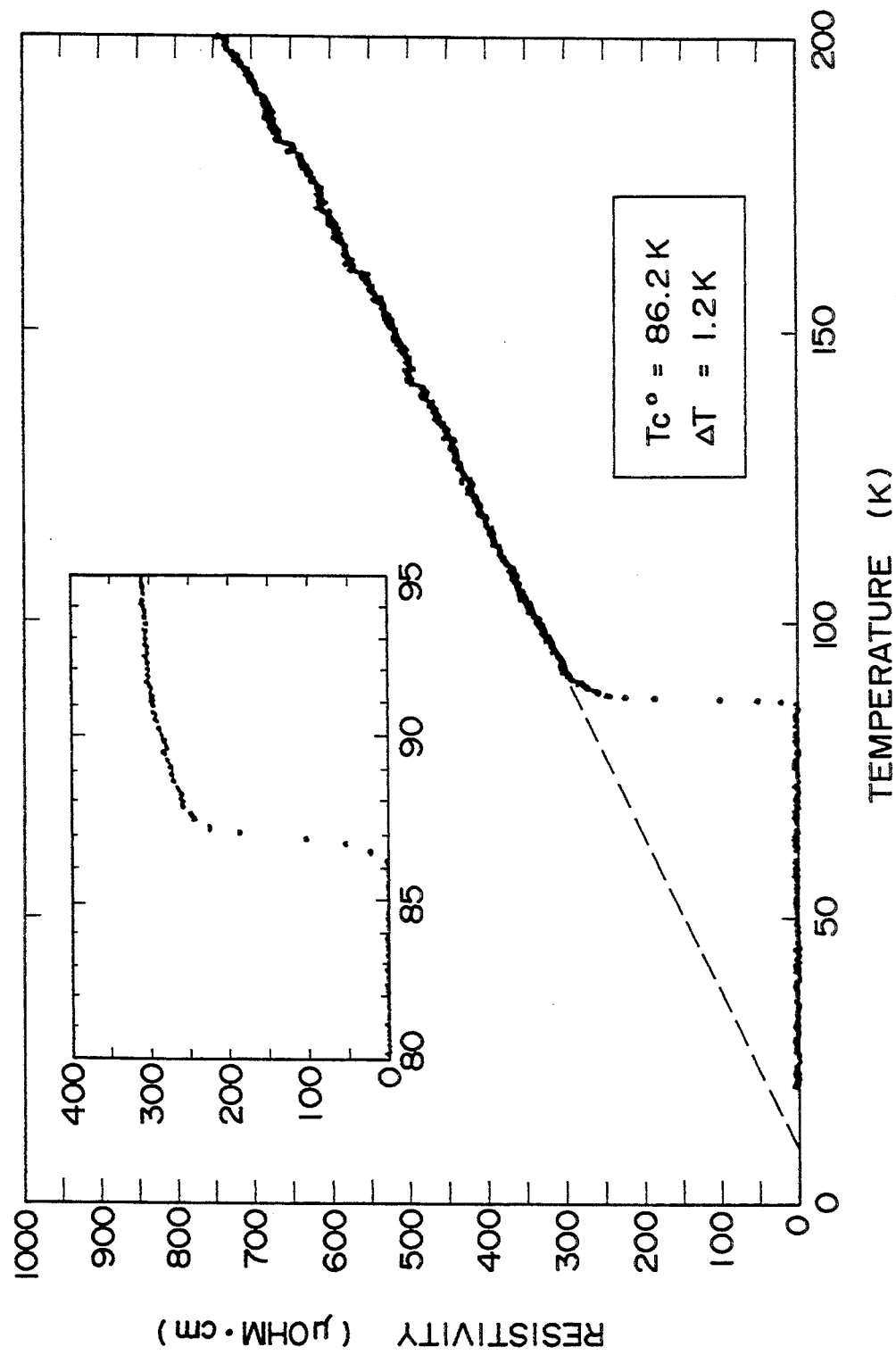
FIG. 2 is a graph showing temperature-resistivity characteristics of the YBa$_2$Cu$_3$O$_x$ film of the composite superconductor obtained in Example 1.

A Y$_2$O$_3$ single crystal substrate was prepared by the Verneuil method. On the (100) plane of the substrate a thin film of YBa$_2$Cu$_3$O$_x$ (x is a number of 6–7) was formed by the pulsed laser deposition method using an energy density of 1 J/cm$^2$, an oxygen partial pressure of 1$\times$10$^2$ mTorr and a substrate temperature of 700° C. to obtain a composite superconductor. The thickness of the YBa$_2$Cu$_3$O$_x$ film was 700 Å. The film as deposited was tested for superconducting characteristics by the four-terminal resistivity measuring method. The results are shown in FIG. 2, from which the composite superconductor has a zero resistivity temperature T$^{R=0}$ of 86.2K and a superconducting transition temperature width ΔT of 1.2K. The temperature-resistivity curve shown in FIG. 2 also indicates that the extraporated temperature in the normal conducting side is about 0K.

Figure 3:
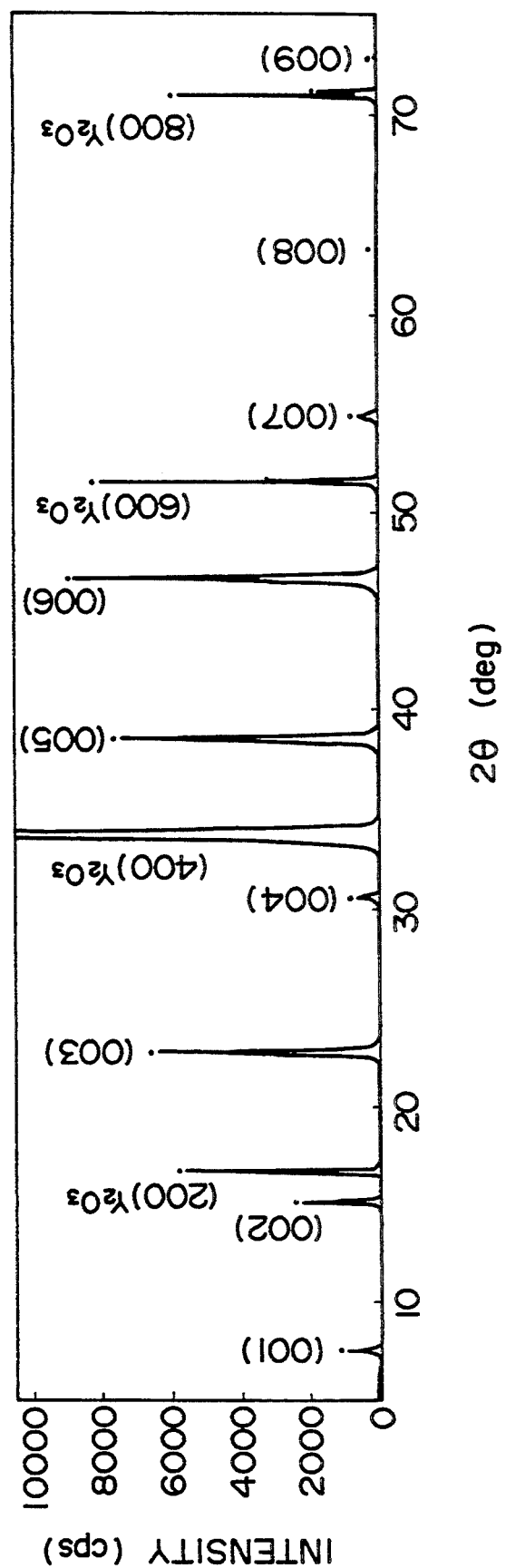
FIG. 3 is an X-ray diffraction pattern of the composite superconductor obtained in Example 1.

The composite superconductor was also subjected to an X-ray diffraction analysis to give the results shown in FIG. 3. From FIG. 3, it is seen that the superconducting film is a c-axis oriented film and contains no inclusions.

The rocking curves of the (018) and (108) planes of the $YBa_2Cu_3O_x$ film and the (311) plane of the $Y_2O_3$ substrate of the composite superconductor obtained above with respect to the <011> plane of the $Y_2O_3$ substrate are shown in FIG. 4. The diffraction peak attributed to the (311) plane of the $Y_2O_3$ single crystal substrate is separated into several peaks, indicating that the $Y_2O_3$ is not perfect crystal in strict sense but contains deviation Of the crystal orientation. The, diffraction peaks attributed to the (018) and (108) planes of the $YBa_2Cu_3O_x$ superconducting film are present in the <011> direction of the substrate and are separated and distributed with nearly the same breadth. This suggests that the <110> direction of the $YBa_2Cu_3O_x$ film is parallel with the <010> direction of the $Y_2O_3$ substrate. Further, the results shown in FIG. 3 indicates that the <001> direction of the $YBa_2Cu_3O_x$ film is parallel with the <100> direction of the $Y_2O_3$ substrate. This follows that there is good lattice matching between the substrate and the superconducting film.

Figure 5:
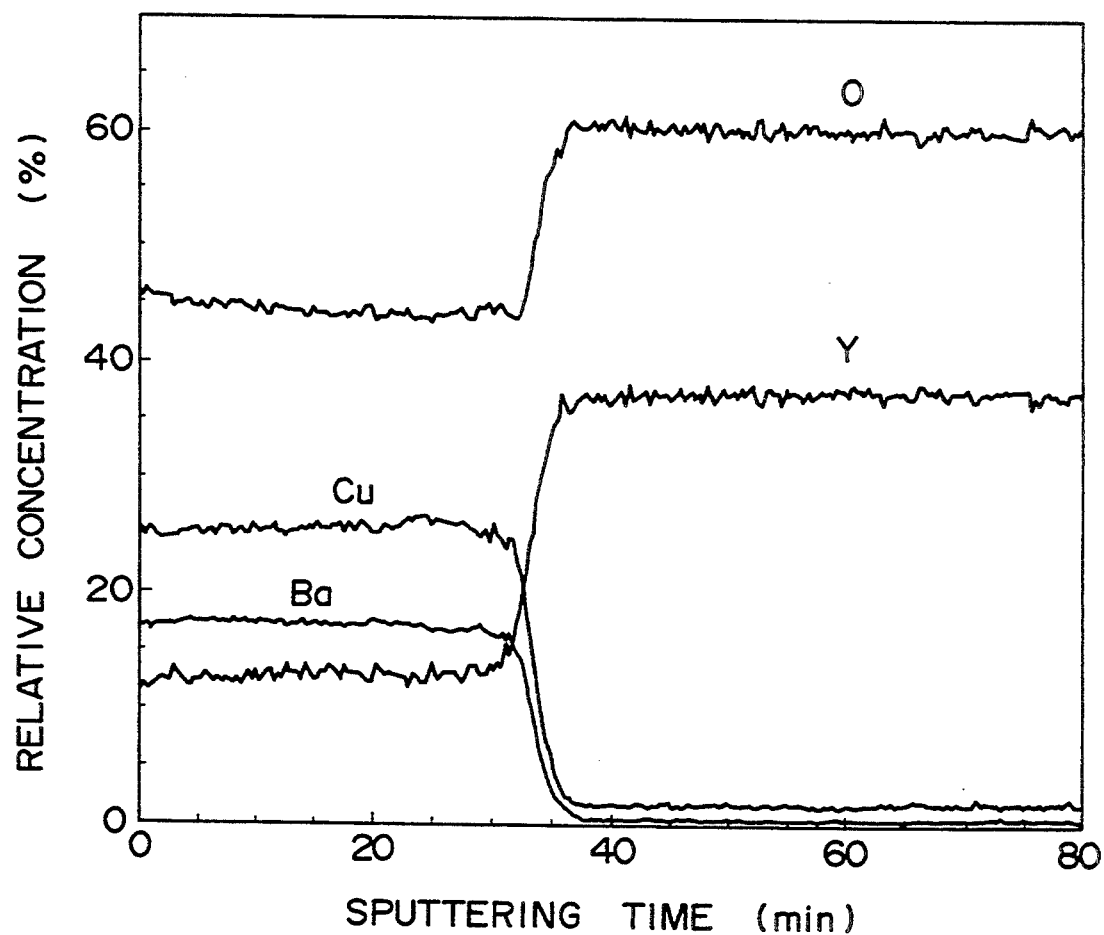
FIG. 5 is an Auger depth profile of the composite superconductor obtained in Example 1.

FIG. 5 shows an Auger depth profile obtained by the Auger electron spectroscopy of the composite superconductor obtained above. It is also revealed that the depth (Δt) of the film/substrate interface is below 120 Å. This indicates that almost no interfacial diffusion or interfacial reaction occurs and the interface is very sharp.

EXAMPLE 2

Example 1 was repeated in the same manner as described except that the formation of a thin film of $YBa_2Cu_3O_x$ (x is a number of 6-7) was effected by the chemical vapor deposition method in lieu of the pulsed laser deposition method. A composite superconductor having properties similar to those of Example 1 was obtained.

EXAMPLE 3

Example 2 was repeated in the same manner as described except that the $Y_2O_3$ substrate was overlaid with a superconducting film of $NdBa_2Cu_3O_x$, $YbBa_2Cu_3O_x$, $EuBa_2Cu_3O_x$ or $ErBa_2Cu_3O_x$. The thickness, $Tc^{R=0}$ and ΔT of the superconducting film as deposited were as summarized in Table 1.

TABLE 1

| Metal Oxides | Film Thickness (Å) | $Tc^{R=0}$ (K) | ΔT (K) |
|---|---|---|---|
| $NdBa_2Cu_3O_x$ | 920 | 85.7 | 1.0 |
| $YbBa_2Cu_3O_x$ | 220 | 79.4 | 1.3 |
| $EuBa_2Cu_3O_x$ | 130 | 86.0 | 1.3 |
| $ErBa_2Cu_3O_x$ | 340 | 80.1 | 1.2 |

EXAMPLE 4

Figure 6:
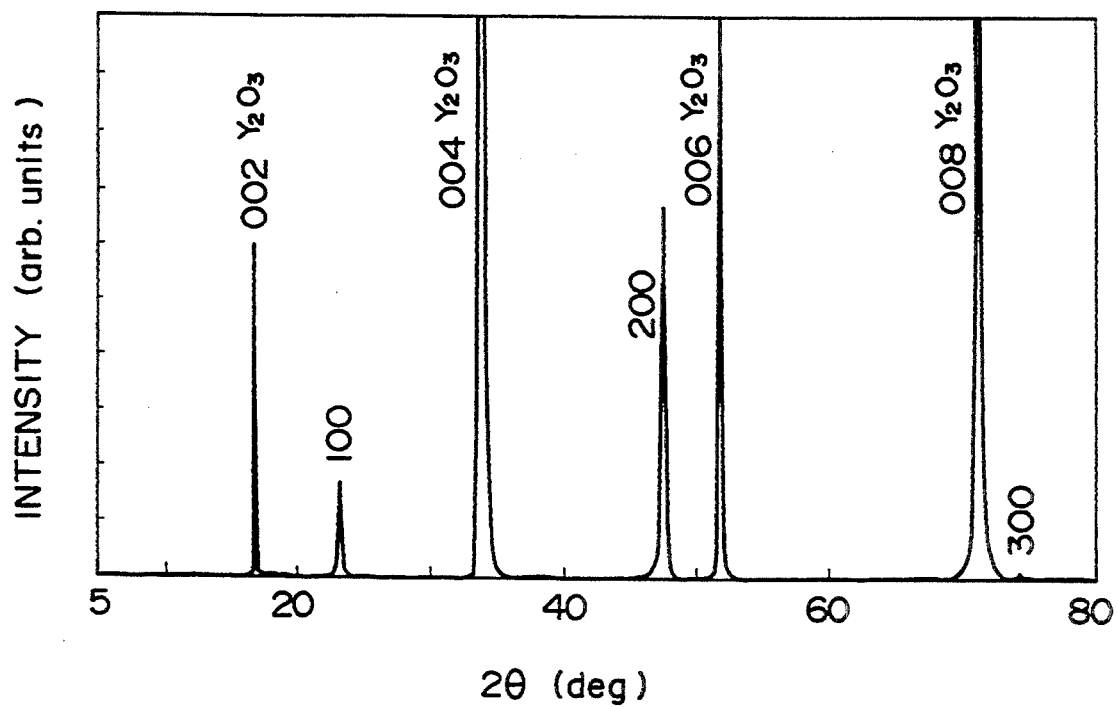
FIG. 6 is an X-ray diffraction pattern of the composite superconductor obtained in Example 3.

Example 1 was repeated in the same manner as described except that the vacuum deposition was performed at a substrate temperature of 650° C. The composite superconductor showed good superconducting characteristic similar to that obtained in Example 1. The composite superconductor was subjected to an X-ray diffraction analysis to give the results shown in FIG. 6. From FIG. 6, it is seen that the superconducting film is an a-axis oriented film and contains no inclusions.

What is claimed is:

1. A composite superconductor consisting of a substrate of $Y_2O_3$ single crystal, and an a-axis oriented superconducting layer provided on a surface of said substrate and formed of metal oxides having the following formula:

$YBa_2Cu_3O_x$ $[LnBa_2Cu_yO_x]$ wherein x is 6–7.

2. A composite superconductor as claimed in claim 1, wherein said superconducting layer has a thickness in the range of from 60 Å to 5000 Å.

3. A composite superconductor in accordance with claim 1 wherein said superconducting layer is epitaxial with said substrate.

* * * * *

UNITED STATES PATENT AND TRADEMARK OFFICE
CERTIFICATE OF CORRECTION

PATENT NO. : 5,420,103
DATED : May 30, 1995
INVENTOR(S) : Oishi et al.

It is certified that error appears in the above-indentified patent and that said Letters Patent is hereby corrected as shown below:

Column 3, line 4, after "about" delete "OK" and insert --O K--.

Signed and Sealed this

Nineteenth Day of December, 1995

Attest:

BRUCE LEHMAN

Attesting Officer     *Commissioner of Patents and Trademarks*